(12) United States Patent
Hong et al.

(10) Patent No.: US 8,390,576 B2
(45) Date of Patent: Mar. 5, 2013

(54) METHODS AND APPARATUS FOR DETECTING USER'S TOUCH ON A TOUCH PANEL

(75) Inventors: Hao-Ping Hong, Hsinchu County (TW); Yen-Hsun Hsu, Hsinchu County (TW)

(73) Assignee: Mediatek, Inc., Science-Based Industrial Park, Hsin-Chu (TW)

( * ) Notice: Subject to any disclaimer, the term of this patent is extended or adjusted under 35 U.S.C. 154(b) by 752 days.

(21) Appl. No.: 12/202,337

(22) Filed: Sep. 1, 2008

(65) Prior Publication Data

US 2010/0053090 A1  Mar. 4, 2010

(51) Int. Cl.
  *G06F 3/041* (2006.01)
(52) U.S. Cl. ..................... 345/173; 178/18.03
(58) Field of Classification Search .......... 345/173–179; 178/18.01–18.09, 18.11; 341/155
  See application file for complete search history.

(56) References Cited

U.S. PATENT DOCUMENTS

| | | | | |
|---|---|---|---|---|
| 4,210,775 A | * | 7/1980 | Rodgers et al. | 178/20.02 |
| 5,428,192 A | * | 6/1995 | Chen et al. | 178/20.03 |
| 5,825,352 A | | 10/1998 | Bisset et al. | |
| 7,701,447 B2 | * | 4/2010 | Lii et al. | 345/173 |
| 7,868,874 B2 | * | 1/2011 | Reynolds | 345/173 |
| 2005/0024065 A1 | * | 2/2005 | Umeda et al. | 324/663 |
| 2007/0262966 A1 | * | 11/2007 | Nishimura et al. | 345/173 |
| 2008/0012835 A1 | * | 1/2008 | Rimon et al. | 345/173 |

* cited by examiner

*Primary Examiner* — Stephen Sherman
(74) *Attorney, Agent, or Firm* — Winston Hsu; Scott Margo

(57) ABSTRACT

A method for detecting a user's touch on a touch panel includes: deriving a plurality of geometric differences of a first direction of the touch panel, wherein each of the geometric differences of the first direction represents a difference between respective coupling amounts at two locations of a plurality of locations of the first direction on the touch panel; and analyzing the geometric differences of the first direction to obtain at least one analysis result, wherein the analysis result comprises information representing whether the user touches the touch panel in one or more places.

20 Claims, 3 Drawing Sheets

METHODS AND APPARATUS FOR DETECTING USER'S TOUCH ON A TOUCH PANEL

BACKGROUND

The present invention relates to touch panels, and more particularly, to methods and apparatus for detecting a user's touch on a touch panel.

Touch panels have been widely used in portable devices. For example, they can be implemented as displays or fingerprint readers which are utilized in personal digital assistants (PDAs) and laptop computers. Typically, analog-to-digital converters (ADCs) are utilized for respectively converting signals from different locations on a touch panel into digital values in order to detect a user's touch on the touch panel. According to a related art method, the location where the user touches on the touch panel can be determined by detecting a maximum of the digital values. More particularly, it is suggested by the related art method that the location corresponding to the maximum that one of the ADCs' outputs is substantially the location where the user touches on the conventional touch panel.

By the architecture provided by the related art, a large dynamic range for each of the ADCs is required in order to detect a possible maximum of the digital values, thereby increasing the associated cost. In practice, if any of the ADCs does not linearly convert the signal, low accuracy of the detection mentioned above will be introduced. As a result, a large linear region for each of the ADCs is also required.

Due to strict requirements of the ADCs, such as the large dynamic range and the large linear region, the overall cost of a portable device implemented with a conventional touch panel cannot be reduced further. Thus, a novel method and associated apparatus are required for solving the related art problems.

SUMMARY

It is therefore an objective of the claimed invention to provide methods and apparatuses to solve the above mentioned problems for detecting a user's touch on a touch panel.

An exemplary embodiment of a method for detecting a user's touch on a touch panel comprises: deriving a plurality of geometric differences of a first direction of the touch panel, wherein each of the geometric differences of the first direction represents a difference between respective coupling amounts at two locations of a plurality of locations of the first direction on the touch panel; and analyzing the geometric differences of the first direction to obtain at least one analysis result, wherein the analysis result comprises information representing whether the user touches the touch panel in one or more places.

An exemplary embodiment of an apparatus for detecting a user's touch on a touch panel comprises an analog-to-digital conversion module and a processing unit. The analog-to-digital conversion module is arranged to perform analog-to-digital conversion on respective coupling amounts at a plurality of locations of a first direction of the touch panel. In addition, the processing unit is arranged to detect a user's touch by utilizing the analog-to-digital conversion module, in order to derive a plurality of geometric differences of the first direction. Additionally, each of the geometric differences of the first direction represents a difference between respective coupling amounts at two locations of the plurality of locations of the first direction on the touch panel, and the processing unit analyzes the geometric differences of the first direction to obtain at least one analysis result, wherein the analysis result comprises information representing whether the user touches the touch panel in one or more places.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
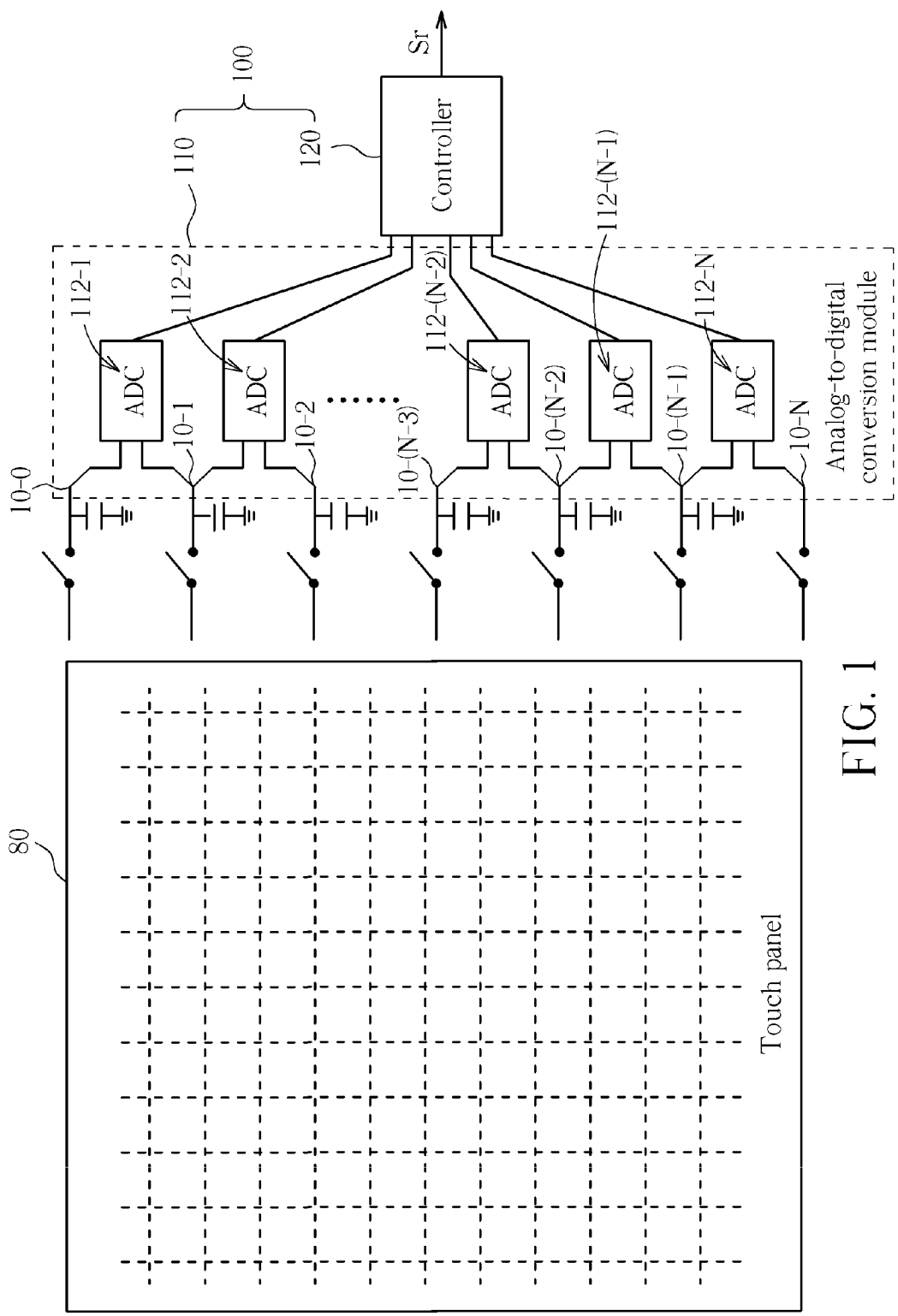
FIG. 1 is a diagram of an apparatus for detecting a user's touch on a touch panel according to a first embodiment of the present invention.

FIG. 1 is a diagram of an apparatus 100 for detecting a user's touch on a touch panel 80 according to a first embodiment of the present invention. As shown in FIG. 1, a plurality of dashed lines are utilized for parabolically illustrating at least a portion of sensing mechanisms of the touch panel 80, such as touch sensors disposed on the intersections of the dashed lines. The number and arrangement of the sensing mechanisms shown in FIG. 1 are only for illustrative purposes, and are not meant to be a limitation of the present invention. In addition, the sensing mechanisms in this embodiment (e.g. the touch sensors) can be coupled to intermediate circuits comprising switches and capacitors such as those coupled to terminals 10-0, 10-1, 10-2, . . . , 10-(N−3), 10-(N−2), 10-(N−1), and 10-N shown in FIG. 1. Within the intermediate circuits mentioned above, the switches and capacitors are utilized for selectively storing coupling amounts of the touch panel 80 that are derived from the sensing mechanisms. As a result, the apparatus 100 may performing detection on the coupling amounts to determine the user's touch on the touch panel 80.

According to this embodiment, the apparatus 100 comprises an analog-to-digital conversion module 110 and a processing unit such as a controller 120. In addition, the analog-to-digital conversion module 110 comprises a plurality of analog-to-digital converters (ADCs) such as a first set of ADCs 112-1, 112-2, . . . , 112-(N−2), 112-(N−1), and 112-N. Each of the ADCs 112-1, 112-2, . . . , and 112-N is coupled to two of the terminals 10-0, 10-1, . . . , and 10-N as shown in FIG. 1, rather than being coupled to a single terminal of the terminals 10-0, 10-1, ..., and 10-N.

Figure 2:
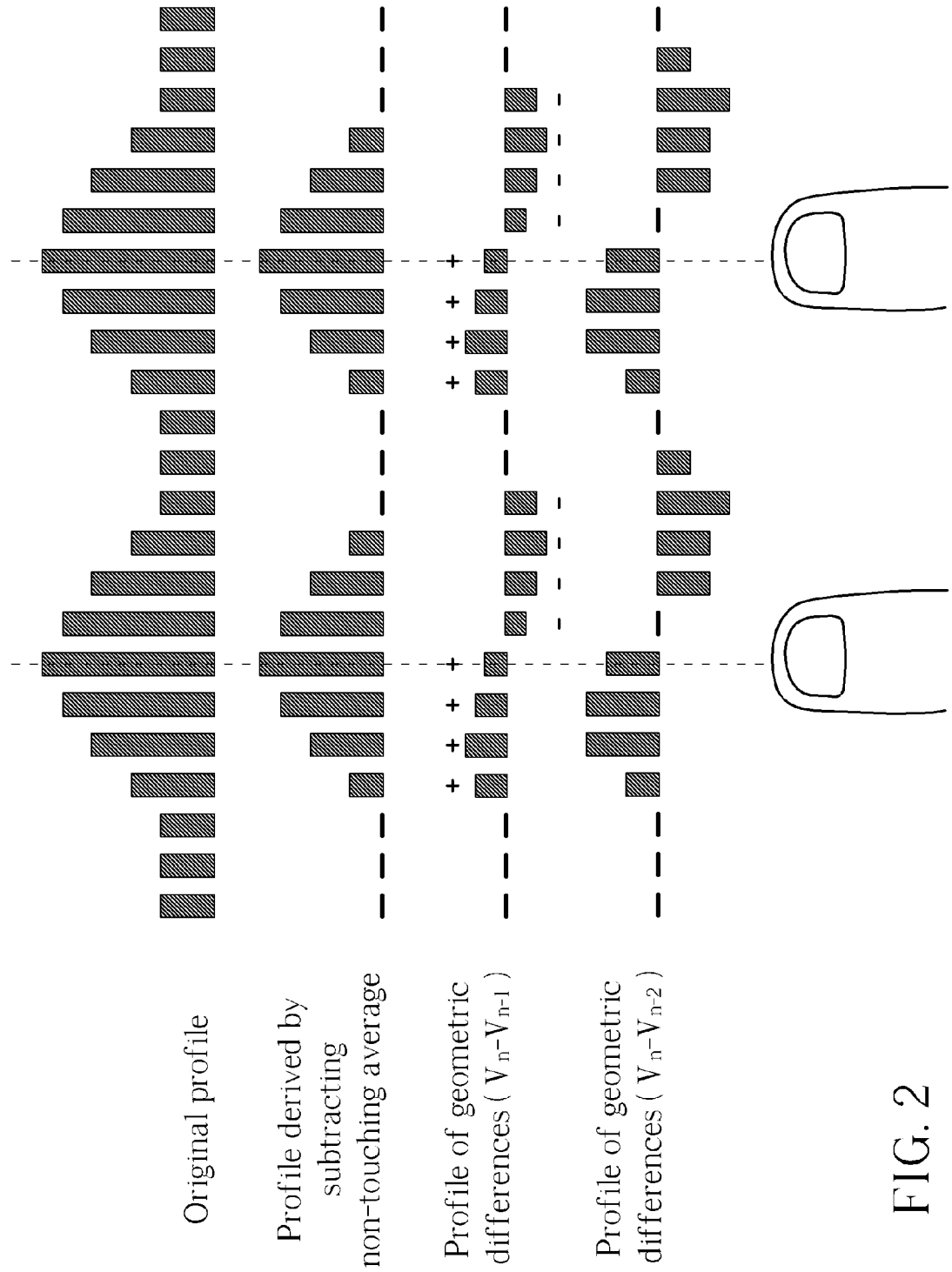
FIG. 2 illustrates exemplary profiles of geometric differences utilized in a method for detecting a user's touch on a touch panel according to one embodiment of the present invention, where a profile derived by subtracting a non-touching average is also illustrated for comparison purposes.

FIG. 2 illustrates exemplary profiles of geometric differences utilized in a method for detecting a user's touch on a touch panel such as the touch panel 80 according to one embodiment of the present invention, where a profile derived by subtracting a non-touching average is also illustrated for comparison. This method can be applied to the apparatus 100 shown in FIG. 1, and can be implemented by utilizing the apparatus 100. Thus, the method mentioned above is first described according to the first embodiment.

The analog-to-digital conversion module 110 performs analog-to-digital conversion on respective coupling amounts at a plurality of locations of a first direction of the touch panel 80 (e.g. the vertical direction in this embodiment). Please note that the coupling amounts mentioned above are representatives of how much strength that the user utilizes when touching on the touch panel 80. In practice, some electronic characteristics, such as inductance values or voltage values, can be utilized for representing the coupling amounts.

The processing unit of this embodiment, i.e. the controller 120, is arranged to detect a user's touch by utilizing the analog-to-digital conversion module 110, in order to derive a plurality of geometric differences of the first direction. In order to achieve the detection operations, for example, the detection operations of the vertical direction of the touch panel 80, a plurality of sensing mechanisms (parabolically illustrated with dashed lines) arranged in one vertical column are selected, and detected by the analog-to-digital conversion module 110 through wires of the horizontal direction of the touch panel 80, respectively.

In this embodiment, each of the geometric differences of the first direction (e.g. the vertical direction) represents a difference between respective coupling amounts at two locations of the plurality of locations of the first direction on the touch panel 80.

In practice, voltage levels $V_0, V_1, \ldots,$ and $V_N$ at the terminals 10-0, 10-1, ..., and 10-N can be utilized in one example as representatives of the coupling amounts at the corresponding locations of the first direction. According to a first strategy of the exemplary method, the two locations are associated with two adjacent touch sensors of the touch panel 80, where the physical distance between the two adjacent touch sensors need not be equivalent to the physical distance between adjacent display pixels regarding a resolution of a display associated with the touch panel 80, and more particularly, is typically greater than the physical distance between the adjacent display pixels in this embodiment. As a result, a geometric difference can be expressed as $(V_n-V_{n-1})$, where $n=1, 2, \ldots,$ or $N$ in this situation. Further explanation of the expression $(V_n-V_{n-1})$ is detailed below.

As a result of the circuitry arrangement in the analog-to-digital conversion module 110, the ADCs 112-1, 112-2, ..., and 112-N differentially perform analog-to-digital conversion on the respective coupling amounts at the plurality of locations of the first direction to generate a plurality of digital values. That is, in this embodiment, each ADC 112-1 of the ADCs 112-1, 112-2, ..., and 112-N utilizes two coupling amounts of the respective coupling amounts at the plurality of locations as differential inputs of the ADC 112-J (J=1, 2, ..., or N here), and performs analog-to-digital conversion on the two coupling amounts to generate one of the digital values. Thus, the processing unit of this embodiment (i.e. the controller 120) utilizes the digital values as the geometric differences, e.g. which can be expressed as $(V_n-V_{n-1})$ in the example, respectively.

According to this embodiment, the controller 120 analyzes the geometric differences of the first direction to obtain at least one analysis result accordingly, and outputs the analysis result through a resultant signal Sr. Here, the analysis result carried by the resultant signal Sr comprises information representing whether the user touches the touch panel 80 in one or more places. More particularly, the analysis result can further comprise coordinate value(s) of at least one location within the one or more places of the first direction.

It should be noted that in the above descriptions, the term "place" is especially utilized for describing where the user touches on the touch panel 80, in order to prevent from ambiguous meanings and to differentiate from the term "location". As a place where the user touches on the touch panel 80 may be an area to the touch panel 80 when the user touches the touch panel 80 with his/her fingertip, and as a place where the user touches on the touch panel 80 may be substantially a point to the touch panel 80 when the user touches the touch panel 80 with a pen, the location detected by the apparatus 100 should be within the aforementioned one or more places according to this embodiment.

Referring to FIG. 2, the topmost profile (labeled "Original profile") represents an original profile of the voltage levels $V_0, V_1, \ldots,$ and $V_N$ at the terminals 10-0, 10-1, ..., and 10-N, respectively. The next profile (labeled "Profile derived by subtracting non-touching average"), which is provided for the purpose of illustrating a related art, indicates that a related art method still requires a large dynamic range of each ADC utilized for deriving this profile, where a large linear region of the ADC and complex processing circuit are also required according to the related art method.

The third profile (labeled "Profile of geometric differences $(V_n-V_{n-1})$") is derived according to the first strategy of the exemplary method. According to this embodiment, through the analysis performed by controller 120, a location where a polarity change occurs can be substantially defined as a location touched by the user. For better comprehension, the location touched by the user is that one positive geometric difference (denoted as "+" in FIG. 2), one negative geometric difference (denoted as "−" in FIG. 2), or both of them are located at, which relates to either the polarity change from positive to negative or from negative to positive. As shown in FIG. 2, when the user touches the touch panel 80 in two places, the controller 120 analyzes the geometric differences of the first direction by finding locations where polarity changes occur in order to obtain the analysis result.

Regarding the third profile shown in FIG. 2, it should be noted that, in the example, the analysis of the geometric differences can be based on the polarity change from positive to negative, e.g. corresponding to a negative slop of the third profile. This regulation of analysis is practical, for example, while two fingers are close to each other on the touch panel 80. According to this embodiment, as the geometric differences are calculated as $(V_n-V_{n-1})$ rather than $(V_{n-1}-V_n)$, the controller 120 determines locations where polarity changes occur to be locations where the user touches on the touch panel 80 only when negative slopes of the third profile are encountered. Similarly, if the geometric differences are calculated as $(V_{n-1}-V_n)$, the analysis of the geometric differences can be based on the polarity change from negative to positive, e.g. corresponding to a positive slop of the third profile. As a result, the controller 120 outputs the analysis result through the resultant signal Sr, where the analysis result may further comprise the coordinate values corresponding to the two locations where the user touches on the touch panel 80.

Comparing to the second profile, the third profile indicates that the exemplary method provided by the embodiment requires a smaller dynamic range of analog-to-digital conversion, thus decreasing the associated cost and reducing the occupied area. In addition, the ADCs according to the first strategy of the exemplary method (e.g. the ADCs 112-1, 112-2, ..., and 112-N) should require linear conversion only around a zero-crossing level (e.g. the horizontal dashed line illustrated through the third profile). That is, the exemplary method does not require each utilized ADC of a large linear region but still has good accuracy of the detection.

In contrast to the related art, two processing steps including calculating the non-touching average (i.e. the average level when no finger touches the touch panel 80) and subtracting the non-touching average from each digital value are both not required for the exemplary method and apparatus provided by the embodiment. The processing load is therefore greatly reduced. In addition, it is necessary for the related art to calibrate the non-touching average which easily varies in response to different conditions, such as temperature, humidity, or used time of the touch panel 80. The embodiment can remove the issue of determining whether to subtract a non-touching average, no matter what kind of condition is encountered. Therefore, the performance of the exemplary method and apparatus is significantly improved in comparison with the related art.

For simplicity, only the first set of ADCs 112-1, 112-2, ..., and 112-N together with their wiring to the terminals 10-0, 10-1, ..., and 10-N for the vertical direction are illustrated. A second set of ADCs together with their wiring for the horizontal direction are similar to those for the vertical direction, and are therefore not shown in FIG. 1.

Alternatively, according to a variation of the first embodiment, the first set of ADCs 112-1, 112-2, ..., and 112-N and the second set of ADCs can be implemented within the same analog-to-digital conversion module 110 instead of two separate analog-to-digital conversion modules as mentioned above.

In addition to the operations mentioned above for the vertical direction, similar operations can be implemented for the horizontal direction, and are briefly described as follows.

According to this embodiment, another analog-to-digital conversion module comprising the second set of ADCs for the horizontal direction is arranged to perform analog-to-digital conversion on respective coupling amounts at a plurality of locations of a second direction of the touch panel, where the second direction of this embodiment is the horizontal direction.

The controller 120 of this embodiment further detects a user's touch by utilizing the analog-to-digital conversion module for the horizontal direction in order to derive a plurality of geometric differences of the second direction. According to this embodiment, each of the geometric differences of the second direction represents a difference between respective coupling amounts at two locations of the plurality of locations of the second direction on the touch panel 80. Additionally, the controller 120 analyzes the geometric differences of the second direction to obtain at least one analysis result, and outputs the analysis result through a resultant signal Sr. Similarly, the analysis result carried by the resultant signal Sr may further comprise coordinate value(s) of at least one location within the one or more places of the second direction.

In general, according to different variations of the first embodiment, the two locations mentioned above can be associated with two neighboring but not adjacent touch sensors of the touch panel 80. For example, according to a second strategy of the exemplary method, a geometric difference of the geometric differences can be expressed as $(V_n - V_{n-2})$, where n=2, 3, ..., or N in this situation. According to a third strategy of the exemplary method, a geometric difference of the geometric differences can be expressed as $(V_n - V_{n-2})$, where n=2, 4, 6, ..., etc.

Referring to FIG. 2 again, the bottommost profile (labeled "Profile of geometric differences $(V_n - V_{n-2})$") is derived according to one of the strategies of the exemplary method. Similarly, the bottommost profile also indicates that the exemplary method does not require a large dynamic range or a large linear region of each ADC. The bottommost profile typically occurs in some simplified or special applications according to this embodiment. For example, high accuracy of a location touched by the user is not required; or it is hard to distinguish a difference between coupling amounts of two adjacent touch sensors. In addition, regarding the detection accuracy, a slight shift between a location touched by the user and a location where a polarity change occurs might be calibrated. Similar descriptions are not repeated for the strategies of the exemplary method.

Figure 3:
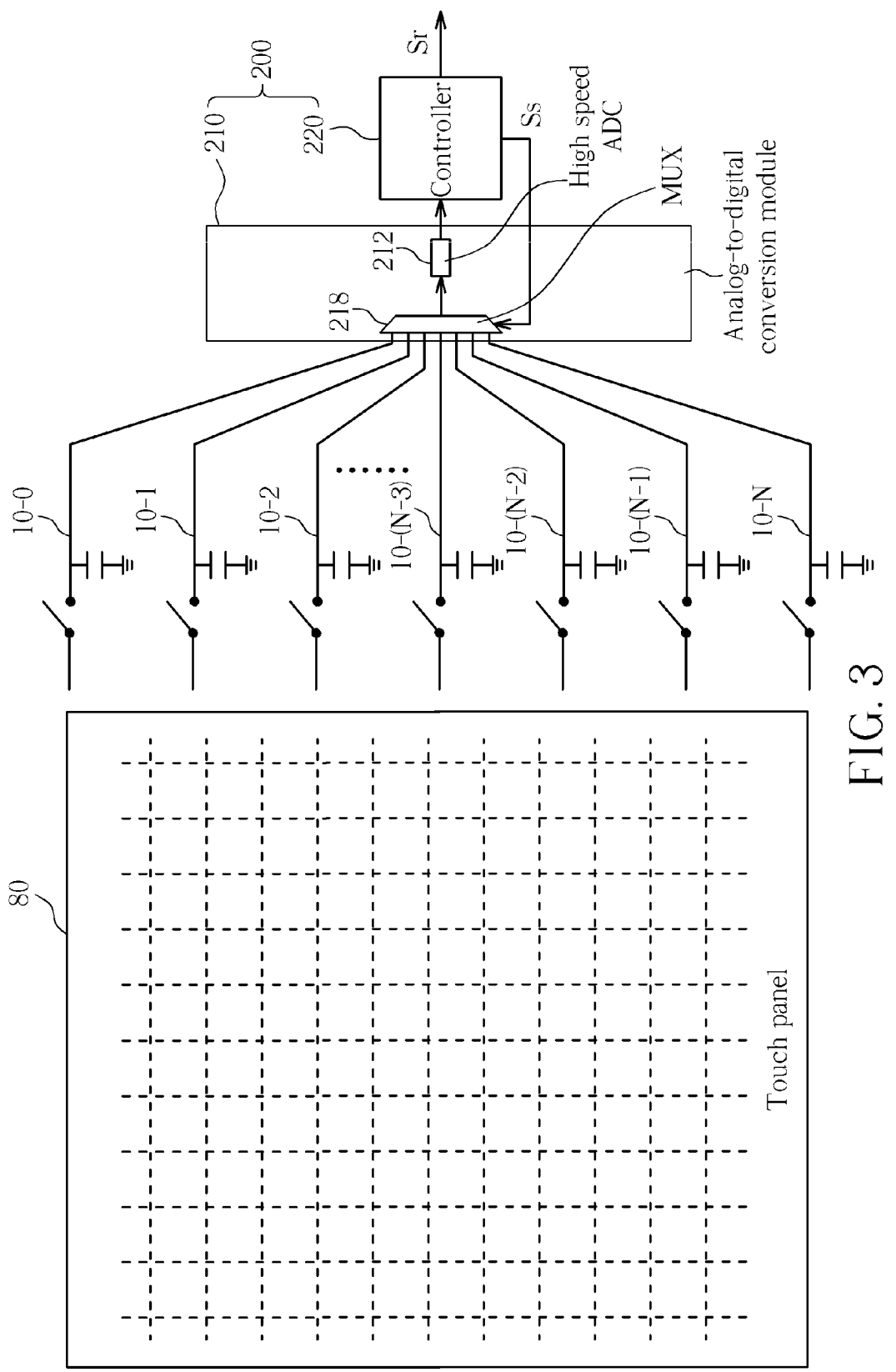
FIG. 3 is a diagram of an apparatus for detecting a user's touch on a touch panel according to a second embodiment of the present invention.

FIG. 3 is a diagram of an apparatus 200 for detecting a user's touch on a touch panel such as the touch panel 80 according to a second embodiment of the present invention. As mentioned as the first embodiment, the voltage levels $V_0$, $V_1$, ..., and $V_N$ at the terminals 10-0, 10-1, ..., and 10-N can be utilized as representatives of the coupling amounts at the corresponding locations of the first direction, respectively.

As shown in FIG. 3, the analog-to-digital conversion module 210 comprises an ADC such as a high speed ADC 212, and further comprises a multiplexer 218 (labeled "MUX"). The high speed ADC 212 is arranged to time-divisionally perform analog-to-digital conversion on the respective coupling amounts at the plurality of locations of the first direction to generate a plurality of digital values, respectively.

More particularly, the multiplexer 218 is arranged to select one or two of the respective coupling amounts at the plurality of locations of the first direction in turns. In one example, with a selection signal Ss from the controller 220, the multiplexer 218 selects (e.g. multiplexes) two of the respective coupling amounts as selected coupling amounts and outputs the two selected coupling amounts into the high speed ADC 212. As a result, the high speed ADC 212 performs analog-to-digital conversion on the two selected coupling amount to generate one of the digital values. Thus, the processing unit of this embodiment (i.e. the controller 220) utilizes the digital values as the geometric differences.

In another example, with a selection signal Ss from the controller 220, the multiplexer 218 selects (e.g. multiplexes) one of the respective coupling amounts as a selected coupling amount and outputs the selected coupling amount into the high speed ADC 212. As a result, the high speed ADC 212 performs analog-to-digital conversion on the selected coupling amount to generate one of the digital values. Thus, the processing unit of this embodiment (i.e. the controller 220) calculates differences between the digital values to generate the geometric differences, respectively. In this example, the controller 220 utilizes the differences between the digital values as the geometric differences, respectively.

It should be noted that, before the digital values are all received from the high speed ADC 212, the processing unit of this embodiment (i.e. the controller 220) can start to generate the geometric differences and start to analyze the geometric differences, in order to speed up the performance of the apparatus 200. In addition, different strategies of the exemplary method, such as the first, the second and the third strategies mentioned above, can also be applied to the apparatus 200 of this embodiment.

According to the second embodiment, a copy of the analog-to-digital conversion module 210 is implemented for the horizontal direction. According to a variation of the second embodiment, the analog-to-digital conversion module 210 and the copy thereof are integrated into the same module, where the multiplexer 218 of this variation selects one or two coupling amounts of all coupling amounts (i.e. the respective coupling amounts at the plurality of locations of the first direction and the respective coupling amounts at the plurality of locations of the second direction) in turns. In addition, different strategies of the exemplary method, such as the first, the second and the third strategies mentioned above, can be applied to the apparatus 200 of this variation. Similar descriptions are not repeated in detail for this variation.

It should be note that a location where the user touches on the touch panel 80 can be detected by determining a zero-crossing point, as similar with that described above. However, this is for illustrative purposes only, and is not meant to be a limitation of the present invention. Other implementation choices regarding detecting a location where the user touches on the touch panel 80 can be applied to variations of the above embodiments. For example, comparing a coupling amount with a threshold level is also workable.

Those skilled in the art will readily observe that numerous modifications and alterations of the device and method may be made while retaining the teachings of the invention.

What is claimed is:

1. A method for detecting a user's touch on a touch panel, the method comprising:
    deriving a plurality of geometric differences of a first direction of the touch panel, wherein each of the geometric differences of the first direction represents a difference between respective coupling amounts at two different locations of a plurality of locations of the first direction on the touch panel, and each of the geometric differences corresponds to a specific location of the locations of the first direction on the touch panel; and
    analyzing the geometric differences of the first direction to obtain at least one analysis result by finding polarity changes in the geometric differences, comprising:
        determining whether the geometric differences corresponding to two different specific locations of the locations of the first direction on the touch panel have different polarities to find the polarity changes;
    wherein the analysis result comprises information representing whether the user touches the touch panel in one or more places.

2. The method of claim 1, wherein the two locations are associated with two neighboring touch sensors of the touch panel.

3. The method of claim 1, wherein the two locations are associated with two adjacent touch sensors of the touch panel.

4. The method of claim 1, wherein the step of deriving the plurality of geometric differences of the first direction of the touch panel further comprises:
    differentially performing analog-to-digital conversion on respective coupling amounts at the plurality of locations of the first direction to generate a plurality of digital values, respectively; and
    utilizing the digital values as the geometric differences, respectively.

5. The method of claim 4, wherein the step of differentially performing analog-to-digital conversion on the respective coupling amounts at the plurality of locations of the first direction to generate the plurality of digital values further comprises:
    utilizing two coupling amounts of the respective coupling amounts at the plurality of locations as differential inputs of an analog-to-digital converter (ADC); and
    utilizing the ADC to perform analog-to-digital conversion on the two coupling amounts to generate one of the digital values.

6. The method of claim 1, wherein the step of deriving the plurality of geometric differences of the first direction of the touch panel further comprises:
    time-divisionally performing analog-to-digital conversion on respective coupling amounts at the plurality of locations of the first direction to generate a plurality of digital values, respectively; and
    calculating differences between the digital values to generate the geometric differences, respectively.

7. The method of claim 6, wherein the step of time-divisionally performing analog-to-digital conversion on the respective coupling amounts at the plurality of locations of the first direction to generate the plurality of digital values further comprises:
    selecting at least one of the respective coupling amounts at the plurality of locations of the first direction in turns; and
    performing the analog-to-digital conversion on the selected coupling amount to generate one of the digital values.

8. The method of claim 1, wherein the analysis result comprises coordinate value of at least one location within the one or more places of the first direction.

9. The method of claim 1, further comprising:
    deriving a plurality of geometric differences of a second direction of the touch panel, wherein each of the geometric differences of the second direction represents a difference between respective coupling amounts at two locations of a plurality of locations of the second direction on the touch panel; and
    analyzing the geometric differences of the second direction to obtain the analysis result.

10. The method of claim 9, wherein the analysis result comprises coordinate value of at least one location within the one or more places of the second direction.

11. An apparatus for detecting a user's touch on a touch panel, the apparatus comprising:
    an analog-to-digital conversion module arranged to perform analog-to-digital conversion on respective coupling amounts at a plurality of locations of a first direction of the touch panel; and
    a processing unit arranged to derive a plurality of geometric differences of the first direction and analyze the geometric differences of the first direction to obtain at least one analysis result by finding polarity changes in the geometric differences, wherein each of the geometric differences of the first direction represents a difference between respective coupling amounts at two different locations of the plurality of locations of the first direction on the touch panel, each of the geometric differences corresponds to a specific location of the locations of the first direction on the touch panel, wherein the processing unit determines whether the geometric differences corresponding to two different specific locations of the locations of the first direction on the touch panel have different polarities to find the polarity changes;

wherein the analysis result comprises information representing whether the user touches the touch panel in one or more places.

12. The apparatus of claim 11, wherein the two locations are associated with two neighboring touch sensors of the touch panel.

13. The apparatus of claim 11, wherein the two locations are associated with two adjacent touch sensors of the touch panel.

14. The apparatus of claim 11, wherein the analog-to-digital conversion module comprises:
   a plurality of analog-to-digital converters (ADCs) arranged to differentially perform analog-to-digital conversion on the respective coupling amounts at the plurality of locations of the first direction to generate a plurality of digital values, respectively;
   wherein the processing unit is arranged to utilize the digital values as the geometric differences, respectively.

15. The apparatus of claim 14, wherein each of the ADCs is arranged to utilize two coupling amounts of the respective coupling amounts at the plurality of locations as differential inputs of the ADC, and perform analog-to-digital conversion on the two coupling amounts to generate one of the digital values.

16. The apparatus of claim 11, wherein the analog-to-digital conversion module comprises:
   an ADC arranged to time-divisionally perform analog-to-digital conversion on the respective coupling amounts at the plurality of locations of the first direction to generate a plurality of digital values, respectively;
   wherein the processing unit is arranged to calculate differences between the digital values to generate the geometric differences, respectively.

17. The apparatus of claim 16, wherein the analog-to-digital conversion module further comprises:
   a multiplexer arranged to select at least one of the respective coupling amounts at the plurality of locations of the first direction in turns;
   wherein the ADC is arranged to perform analog-to-digital conversion on the selected coupling amount to generate one of the digital values.

18. The apparatus of claim 11, wherein the analysis result comprises coordinate value of at least one location within the one or more places of the first direction.

19. The apparatus of claim 11, wherein the analog-to-digital conversion module further performs analog-to-digital conversion on respective coupling amounts at a plurality of locations of a second direction of the touch panel; the processing unit detects the user's touch by utilizing the analog-to-digital conversion module, in order to derive a plurality of geometric differences of the second direction; and each of the geometric differences of the second direction represents a difference between respective coupling amounts at two locations of the plurality of locations of the second direction on the touch panel, and the processing unit analyzes the geometric differences of the second direction to obtain the analysis result.

20. The apparatus of claim 19, wherein the analysis result comprises coordinate value of at least one location within the one or more places of the second direction.

* * * * *